United States Patent [19]

Zehl et al.

[11] Patent Number: 4,503,382

[45] Date of Patent: Mar. 5, 1985

[54] METHOD AND DEVICE FOR CENTROID DETECTION OF A BEAM OF ELECTROMAGNETIC ENERGY

[75] Inventors: Otis G. Zehl, College Park; Michael G. Price, Seabrook; Edward H. David, Jr., College Park, all of Md.

[73] Assignee: Litton Systems, Inc., College Park, Md.

[21] Appl. No.: 435,108

[22] Filed: Oct. 18, 1982

[51] Int. Cl.$^3$ ............................................. G01R 23/16
[52] U.S. Cl. ................................................. 324/77 K
[58] Field of Search .................. 324/77 K; 250/203 R

[56] References Cited

U.S. PATENT DOCUMENTS

| | | | |
|---|---|---|---|
| 3,532,892 | 10/1970 | Murphy | 250/203 R |
| 3,551,680 | 12/1970 | Knight | 250/203 R |
| 3,557,372 | 1/1971 | Ede | 250/203 R |
| 3,954,340 | 5/1976 | Blomqvist | 250/203 R |
| 4,198,634 | 4/1980 | Jernigan | 324/77 K |

OTHER PUBLICATIONS

GTE Sylvania, "Acousto-Optic Processor Feasibility Model for Simultaneous Spatial and Spectral Analysis," Jun. 30, 1978, pp. 1-6, 2-12 to 2-14 and others.

*Primary Examiner*—Stewart J. Levy
*Attorney, Agent, or Firm*—Robert F. Rotella; Michael H. Wallach

[57] ABSTRACT

A device for detecting the centroid of a beam of electromagnetic energy is shown including means for focusing the beam into a blur spot upon a focal plane. Photodetectors located at the focal plane detect the centroid of the blur spot on either side of its nominal location. The intensity of the output from each photodetector is then measured and the difference and sum of these measurements obtained. By dividing the difference by the sum of the resultant signals, it is possible to produce an analog signal which represents the location of the blur spot centroid regardless of its amplitude. This arrangement has particular application in acousto-optic devices for measuring the frequency and direction of arrival of an incoming radio frequency wave.

12 Claims, 12 Drawing Figures

Fig. 1
PRIOR ART
Fig. 2
PRIOR ART
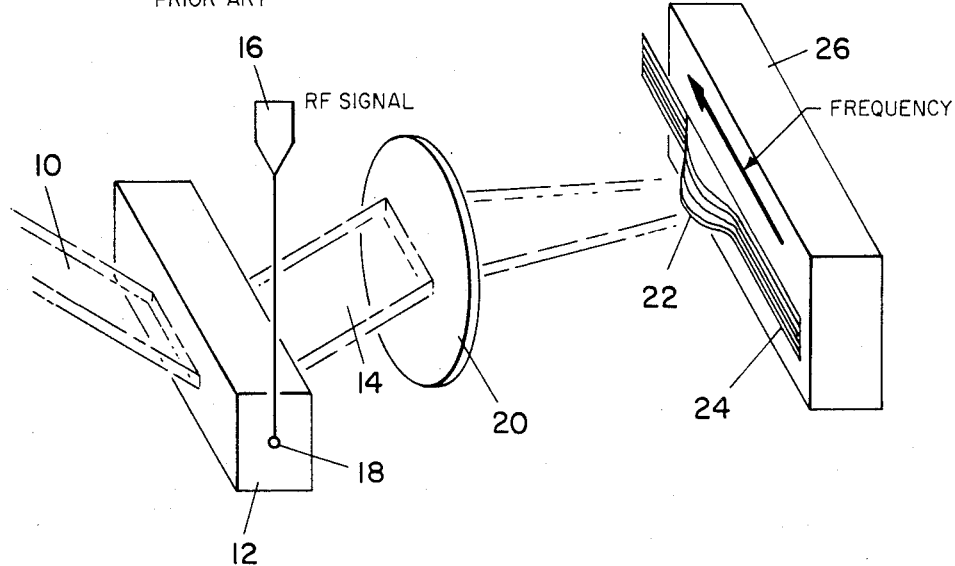
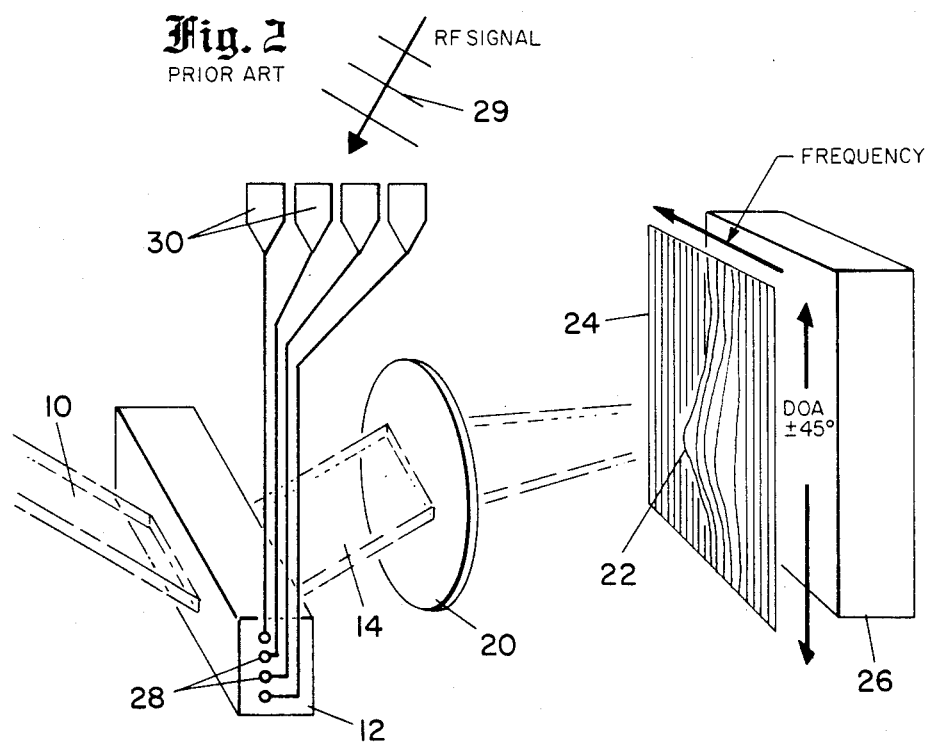

METHOD AND DEVICE FOR CENTROID DETECTION OF A BEAM OF ELECTROMAGNETIC ENERGY

BACKGROUND OF THE INVENTION

The present invention related to a method and device for improved position detection of the centroid of a beam of electromagnetic energy and, more particularly, to a device to detect the centroid of a focused beam referred to as an optical blur spot, obtained from a Bragg cell or acousto-optic (A/O) modulator or deflector. The device uses information from two or more photosensors to measure the centroid of the blur spot. This approach results in a simplified, highly-accurate, high speed measurement of a radio-frequency (RF) input signal to an A/O system.

DESCRIPTION OF PRIOR ART

The term acoustic-optics (A/O) refers to an interaction of light and sound. Typically an RF input signal is first transformed into an acoustic wave in a suitable crystal material, such as lithium niobate. Variation in the index of refraction due to the propagation of the acoustic wave within the crystal can be then used to deflect a beam of electromagnetic energy, usually monochromatic light. This process is the equivalent of the better known Bragg diffraction of x-rays from the planes of a crystal lattice; for this reason the device is called a Bragg deflector or Bragg cell as well as an acousto-optic modulator or deflector. The angular deflection of the optical beam is proportional to the frequency of the original RF input signal. As the process is linear, multiple simultaneous RF input signals yield multiple simultaneous beam deflections corresponding to the distinct input frequencies with the intensity of the individual deflected beam being proportional to the power of the original RF input signal.

Acousto-optics have been used for a variety of applications where light must be modulated or deflected. An important application is the use of acousto-optics for wideband receiving systems. The acousto-optic phenomenon occurs over a substantial bandwidth, 1 GHz with existing devices, so that the frequency content of an unknown signal environment can be resolved by measuring the angle of deflection corresponding to each signal in the environment. Thus, the entire signal environment may be viewed simultaneously by a device that acts like a channelized receiver.

An A/O or Bragg cell receiver has an additional advantage when the cell is fabricated with multiple transducers, each corresponding to a separate element of an antenna array. When an intercepted signal is processed by the Bragg cell and associated optics, light is deflected into a two-dimensional output plane whose two axes represent frequency and direction of arrival (DOA) of the incoming RF signal. Thus, several input signals can be simultaneously sorted by this powerful pair of parameters.

A paper describing this approach prepared for the Naval Research Laboratory, Washington, D.C. 20357, by R. A. Coppock, R. F. Croce, and W. L. Regier was published on June 30, 1978, entitled "Acousto-Optic Processor Feasibility Model For Simultaneous Spatial and Spectral Analysis."

One major problem with wideband A/O receiver systems has not yet been resolved, i.e., optimal photosensor configuration. Because the angular deflection of the optical beam is small, most previous attempts to build a receiver based on this concept have used a plurality of photodiodes in monolithic arrays. These arrays have the inherent disadvantage that they must be sequentially sampled; they are basically serial devices. This means that pulse time of arrival can only be determined to within the period of the read cycle. This is inadequate for many applications where pulse train sorting analysis depends upon time of arrival resolution to at least one microsecond. Because time information is lost, a system using this approach is more properly characterized as a spectrum analyzer rather than a receiver.

A second approach, which retains the parallel structure of the channelized receiver, uses a linear fiber array to channel light from the transform plane of the Bragg cell to individual PIN photodiodes.

This approach does have the value of retaining time information such as pulse width or time of arrival. However, as the number of fibers increases, the difficulty of fabrication and the amount of supporting hardware increase dramatically. This is particularly true when multiple transducers are used on a Bragg cell to simultaneously resolve signal frequency and direction.

These approaches are characterized by one common feature. In each approach, all of the light in a blur spot, representing either the input signal frequency or frequency and direction of arrival, is essentially collected in a single photodiode or pixel. As each photodiode is one of many in a monolithic array, the number of pixels is large. Spot position is inferred only by the pixel being illuminated.

A need continues to exist for a simple photosensor which will unambiguously measure frequency or simultaneous frequency and direction of arrival in a timely fashion.

SUMMARY OF THE INVENTION

Accordingly, an important object of the present invention is to improve the position sensing of a blur spot which may represent a parameter to be measured, such as frequency or frequency and direction of arrival in an A/O receiver.

This object may be accomplished by using information from as little as two (or more) optical sensors to infer or measure the "center-of-gravity" or centroid of the blur spot. Centroid measurement may be accomplished by allowing light from the blur spot to simultaneously fall on more than one photosensor or photodetector element. Position is inferred by comparing responses of the several elements. In cases where the amplitude of the blur spot is constant and does not change with frequency (and thereby position), an alternative approach is useful. This second approach interpolates a graded optical mask between the blur spot and one or more photodetectors. In this fashion, position information is converted into perceived amplitude at the photodetectors.

Both of these approaches apply to frequency measuring and simultaneous frequency and direction-finding systems.

BRIEF DESCRIPTION OF THE DRAWINGS

Other objects and advantages of the present invention will become apparent to those skilled in the art after consideration of the following specification and drawings wherein:

FIG. 1 is a schematic diagram of an acousto-optic deflector of the prior art;

FIG. 2 is a schematic diagram of a multiple transducer acousto-optic deflector, of the prior art, being used with a multiplicity of antenna elements to simultaneously resolve both frequency and direction of arrival of an RF signal;

DETAILED DESCRIPTION OF THE PREFERRED EMBODIMENTS

Figure 3:
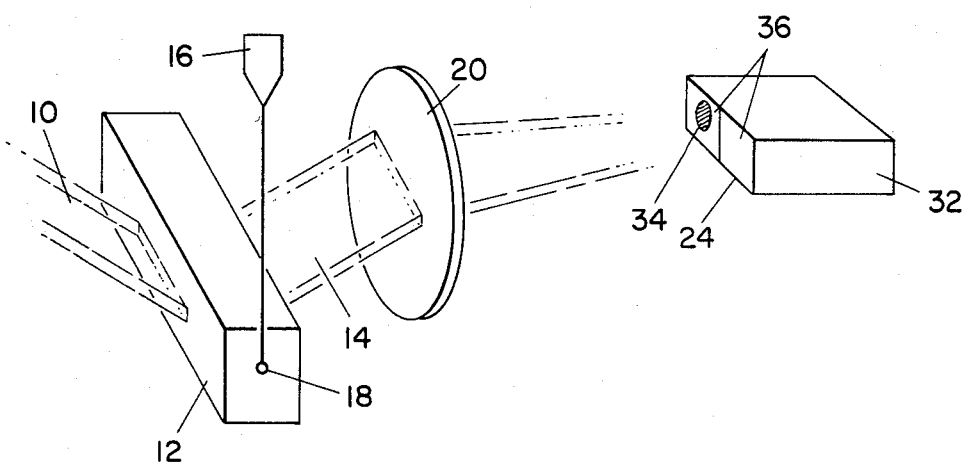
FIG. 3 is a schematic diagram of an acousto-optic receiver incorporating a novel centroid detecting photodetector device.

Typical operation of a prior art acousto-optic modulator is shown in FIG. 1. Electromagnetic energy, in the form of a light beam 10, form a suitable source, such as a laser, not shown, is directed to an acousto-optic deflector or Bragg cell 12 where a portion of that light beam 10 is deflected by diffraction, caused by the passage of an acoustic energy wave through the medium of the cell, into a deflected or first order beam 14 with the remainder of the undeflected or zero order beam being blocked by an optical stop, not shown. An electromagnetic energy wave from an antenna 16 or other RF signal source is converted into an acoustic energy wave within the Bragg cell 12 by a piezoelectric transducer 18. The deflected light beam 14 passes through a transform lens 20 and appears as a blur spot 22 in a focal plane 24, where its position and intensity are sensed by a photosensor 26. When the deflection of blur spot 22 is in but one direction, one-dimensional, shown by the arrow labeled frequency, the photosensor 26 may be formed by a plurality of monolithic photodiodes arranged along an axis parallel to the arrow.

Typical operation of a prior art two-dimensional acousto-optic receiver is shown in FIG. 2. In this case, the light beam 10 is diffracted by a Bragg cell 12 having a multiplicity of transducers 28. The acoustic wavefront within the cell medium preserves the amplitude and phase characteristics of an RF signal 29 arriving at an antenna array 30. Diffracted light from beam 10 is passed from cell 12 through a transform lens 20 and is focused as a blur spot 22 in the two-dimensional transform plane 24, wherein its position is now a function both of RF signal frequency and angle of arrival at the antenna array 30. In this example, a change in RF frequency is evidenced by motion of the blur spot in the horizontal direction; change in angle of arrival causes change substantially along the vertical axis. Position and intensity of a blur spot 22 are resolved by a plurality of photodiodes 26, yielding RF signal frequency, direction of arrival, and signal power. The photodiodes 26 are formed by monolithic photodiodes arranged in a plurality of rows and columns across the surface of sensor 26.

In each of the two prior art acousto-optic receiver system techniques illustrated in FIGS. 1 and 2, the photosensor 26 consists of a large number of picture elements (pixels) or distinct photodiodes elements. Position of the blur spot 22 representing frequency or frequency and DOA is inferred when substantially only a single photodiode element or pixel is illuminated. Thus a relative large number of photodiodes are required. For frequency measuring acousto-optic systems, typical frequency resolution requirements mandate 100 to 1000 distinct pixels. For simultaneous frequency and direction finding, this number is even greater.

Two approaches to this problem have been used in prior art. The first is to use scanning devices such as a TV camera and CCD array, which have inherently large numbers of pixels. These devices have poor time resolution, however, and are not satisfactory in a receiver context where the acquisition of single, short (100 nsec) RF pulses is necessary. The second approach is to build up the necessary minimum number of pixels using fast photoelements and either a multiplicity of discrete components or attempt to integrate the device using modern transistor integration technology. These approaches retain time of arrival information and are successful in capturing short, individual RF signals, but are accompanied by relatively large amounts of supporting electronic hardware.

FIG. 3 shows an embodiment of the apparatus of the present invention for detecting motion of the centroid in one dimension. The principal novelty is the utilization of a centroid detecting photodetector device 32 placed at or near the focal plane 24 for intercepting diffracted light 14 from the Bragg cell 12 to yield position of the diffracted light beam or blur spot 34. As shown in FIG. 3 and as further explained below, only two photodetector elements 36 are required to determine the centroid of a blur spot 34 and thus the frequency of the RF signal received by the single antenna 16. Whether two or more photodetectors 36 are required, a single anode with a separated cathode or a single cathode and divided anode may be used. In the former case, the photodetector acts as a photovoltaic device.

Figure 4B:
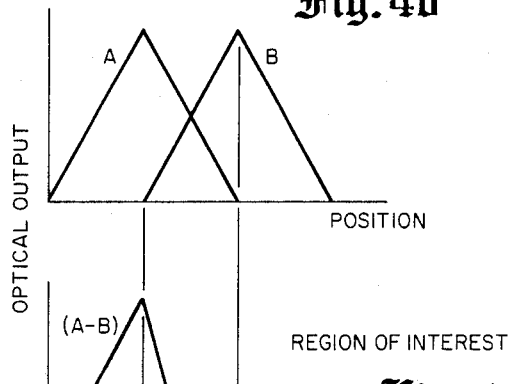
FIGS. 4a, 4b and 4c illustrate how the centroid of a beam of electromagnetic energy may be measured using two optical fibers.
Figure 4C:
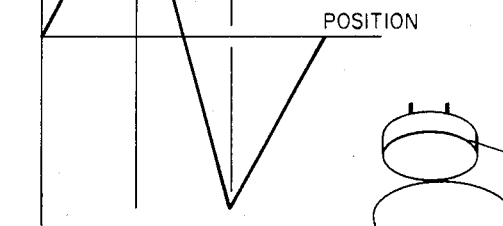
Figure 4A:
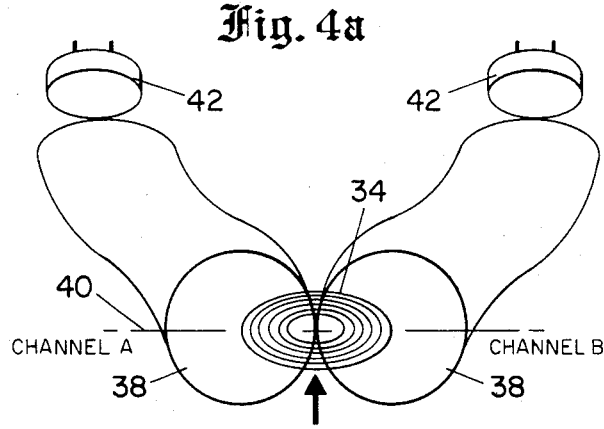

FIG. 4a shows an example of how blur spot centroid detection can be accomplished along a single axis 40 using two optical fibers 38, having circular cross sections, and photodetector elements such as PIN photodiodes 42. As the spot 34 is moved along axis 40 from its nominal position shown at the center between two optical fibers 38 (channel A to channel B), outputs of the two channels produce the overlapping roughly triangular characteristics indicated in FIG. 4b at A and B. The region of overlap is the principal region of interest, because two measurements are available from which to infer the spot position. Differencing (A-B) these output measurements gives a linear relation between output photodiode voltage and spot centroid positions, as shown in FIG. 4c. Note that differencing these outputs gives a steep slope to the line representing the difference. This permits a more accurate representation of centroid location. The curves shown in FIGS. 4b and 4c also represent the output obtained from the photodetectors 36 shown in FIG. 3.

Figure 5:
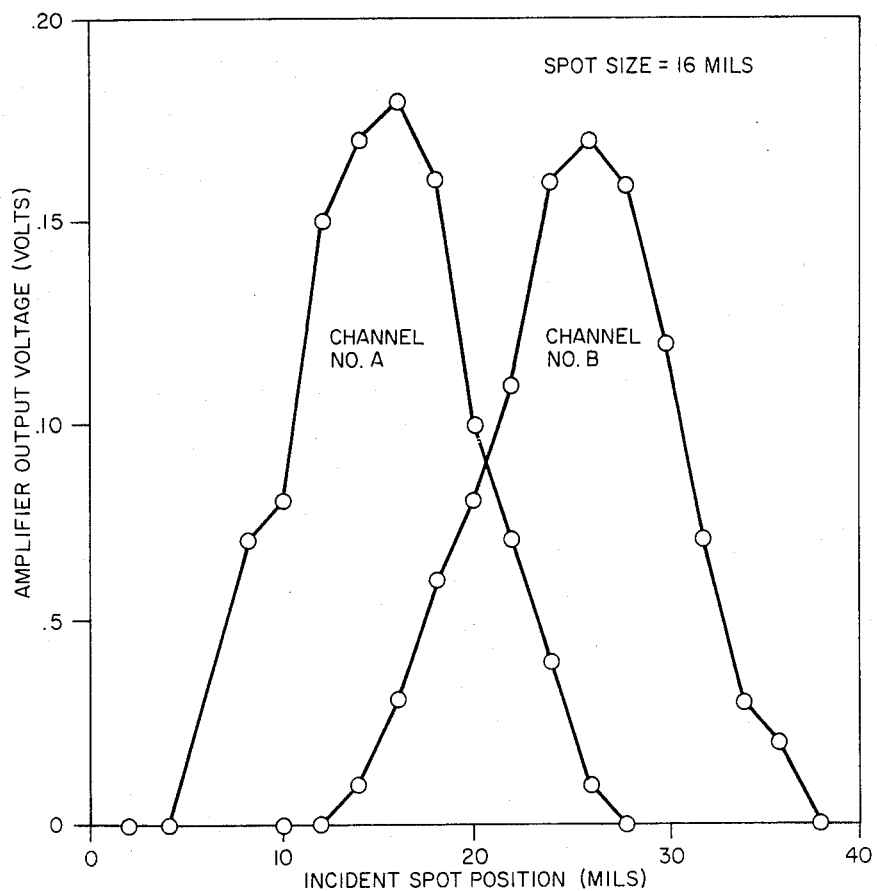
FIG. 5 shows an experimental measurement of the spatial filter function for two adjacent optical fibers.

The spatial filter function characteristics shown in FIGS. 4b and 4c are somewhat idealized. FIG. 5 illustrates actual experimental data for two adjacent optical fibers. The crossover region is however seen to be distinct, and is capable of supporting centroid measurement. The data of FIG. 5 was generated by a blur spot 16 mils in diameter with two optical fibers 10 mils in diameter. In the preferred embodiments, the diameter of the blur spot should be on the order of the optical fiber size. One reason for this is that the arrangement permits amplitude variations witin the blur spot to be cancelled or corrected by suitable electronics described below by summing the signals from both optical fibers 38.

Figure 6:
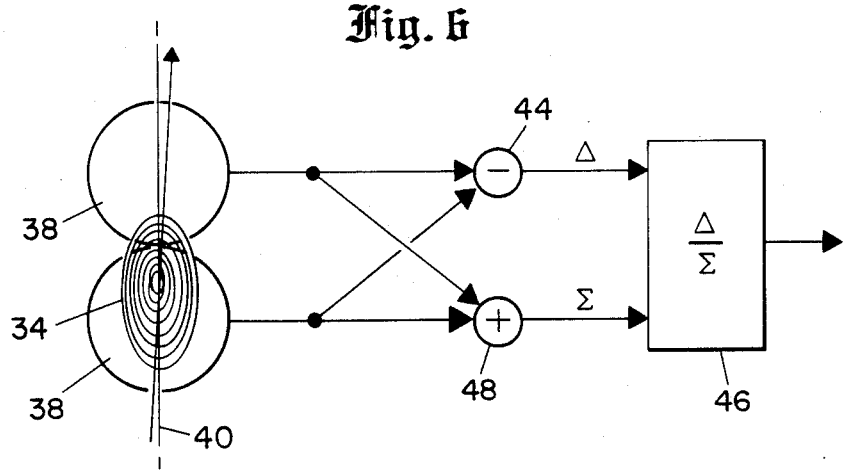
FIG. 6 shows appropriate detector scaling to compensate for varying amplitude of the beam spot.

If the amplitude of the blur spot 34 changes, an additional level of processing is required to extract centroid position. This arrangement is shown in the block diagram of FIG. 6. The difference signal must be scaled by the overall amplitude to yield spot position.

The difference signal is obtained by applying outputs from the photodetectors 36, such as PIN photodiodes 42, to a differential amplifier 44 and then to a dividing circuit 46. Similarly, outputs from photodetectors 36 are applied to a summing amplifier 48 and then to the dividing circuit 46. The outputs represent an analog value of the spot position as it varies from its nominal location between contacting edge surfaces on the periphery of each optical fiber 38. By dividing the difference signal with a signal representing the total amplitude of the blur spot 34 upon the two optical fibers, it may be seen that the output analog signal from circuit 46 is free of variations within the amplitude of blut spot 34.

It is useful to point out that the process as described is analogous to estimating the center of mass or center of gravity of an object of mass M which is approximated by two mass elements $m_1$ and $m_2$ located a fixed distance on either side of a reference original, where $M = m_1 + m_2$. Then the location of the centroid of the mass along axis 40 is given by:

$$\bar{X} = \frac{m_1 - m_2}{m_1 + m_2}$$

Figure 7:
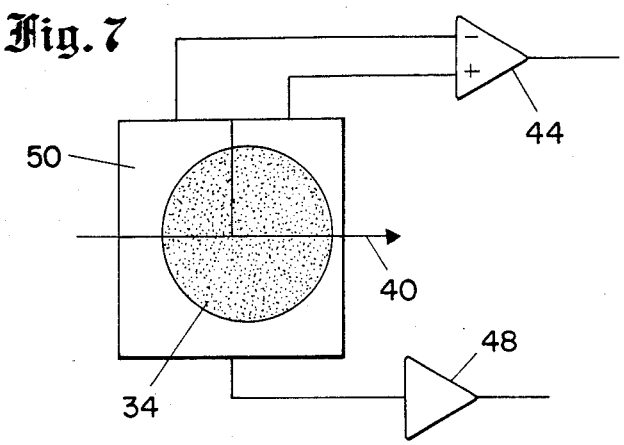
FIG. 7 shows a technique for using three optical fibers to generate centroid sum and difference signals for detector scaling.

An alternate method for producing sum and difference information is shown in FIG. 7. This approach uses three generally rectangular optical fibers 50 which are separated along axis 40. One of the separated fibers is then divided at the nominal location of blur spot 34. Here, the sum information is obtained directly from summing amplifier 48. As before, centroid position is inferred from the ratio of difference signal from amplifier 44 to sum signal from amplifier 48. Note that a flat edge from a square or rectangular optical fiber is preferred to a round edge as the flat contacting fiber edges permit the capture of more light from blur spot 34.

Figure 8:
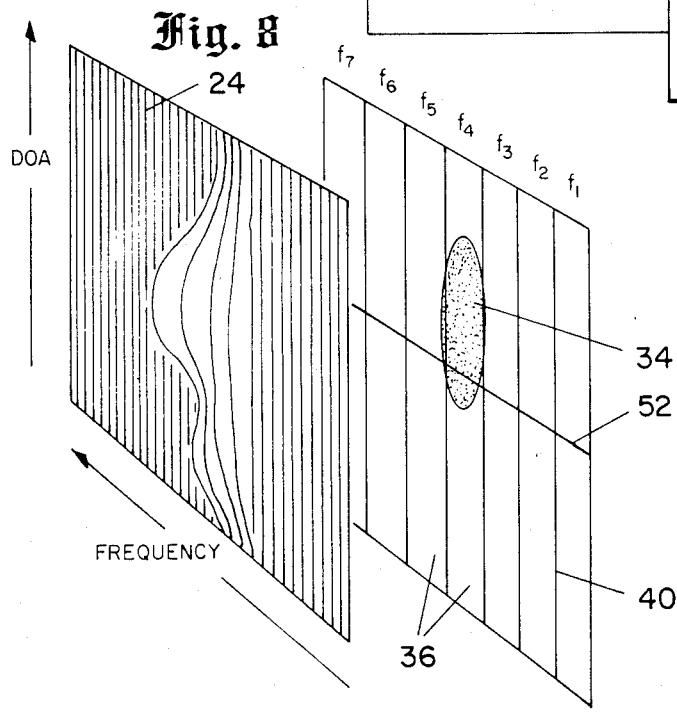
FIG. 8 illustrates a centroid detecting photosensor device for simultaneous detection of frequency and direction of arrival information located in the transform or focal plane of a multi-transducer Bragg cell receiver.

The centroid measurement techniques shown and described thus far apply to one-dimensional frequency measuring acousto-optic receivers. In such a receiver, blur spot position is related directly to signal frequency. The use of centroid measurement can also be applied to two-dimensional simultaneous frequency and direction-finding receiver systems. FIG. 8 shows one example of such application. In this example, frequency is measured by discrete, photodetector elements 36 separated along lines parallel to the first axis 40 for measuring the offset of blur spot 34 along second axis 52, while direction of arrival is measured by centroiding the blur spot 34 as it is offset along the first axis 40. This approach offers discrete parallel frequency channels with simultaneous direction-finding capability with very little increase in complexity compared to the original frequency only measurement. Note, the reference to first and second axes is for convenience of discription. Either axis may be used as the first axis.

Figure 9:
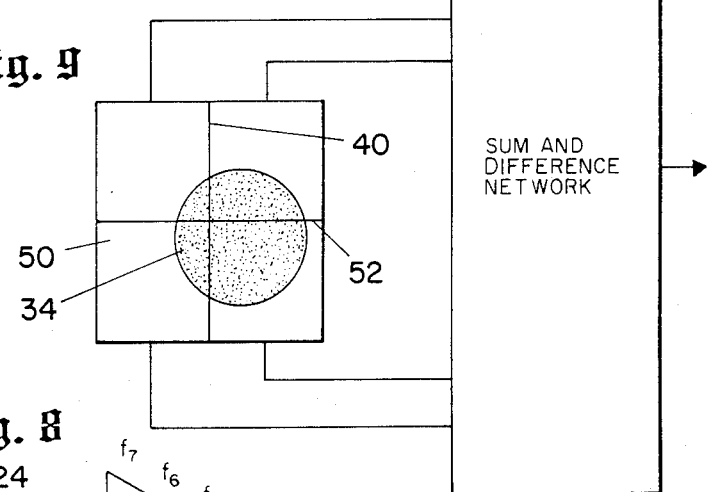
FIG. 9 shows how simultaneous frequency and direction of arrival information could be resolved by using four optical fibers followed by an appropriate sum and difference network.

A four-element sensor for full two-dimensional centroid detection in a receiver using rectangular fibers 50 and photodetectors 36, not shown, is shown in FIG. 9. In this case both frequency and direction of arrival are resolved simultaneously by centroid measurement of the blur spot 34. The four-element sensor formed by rectangular fibers 52 is divided along the first axis 40, shown vertically in FIG. 9, and also along a second axis 52, shown horizontally in FIG. 9. The intersection of axes 40 and 52 occurs at the nominal location of the blur spot 34. In the arrangement, an acousto-optic receiver that receives an incoming RF signal, for example, would cause the blur spot 34 to be deflected along the horizontal axis 52 to the left as the frequency of that incoming signal increased. Similarly, the direction of arrival of that signal would cause the blur spot 34 to deflect vertically along the axis 40. The intensity of the signal generated by blur spot 34 on each of the rectangular optical fibers 50 is transmitted to photodectors which generate a voltage output applied to a sum and difference network 54. Within network 54, the output from each photodetector is summed while a difference signal for each sensor is also obtained. The resultant difference signals are then divided by the sum to produce an analog indication of the precise location of the centroid of spot 36 upon the fiber optics 50.

It is useful to note that if an amplitude variation does not occur, then scaling by dividing the difference by the sum of the signal is not necessary. This might occur in a receiver system when limiting amplifiers are used to improve dynamic range, for example, as described below.

Figure 10:
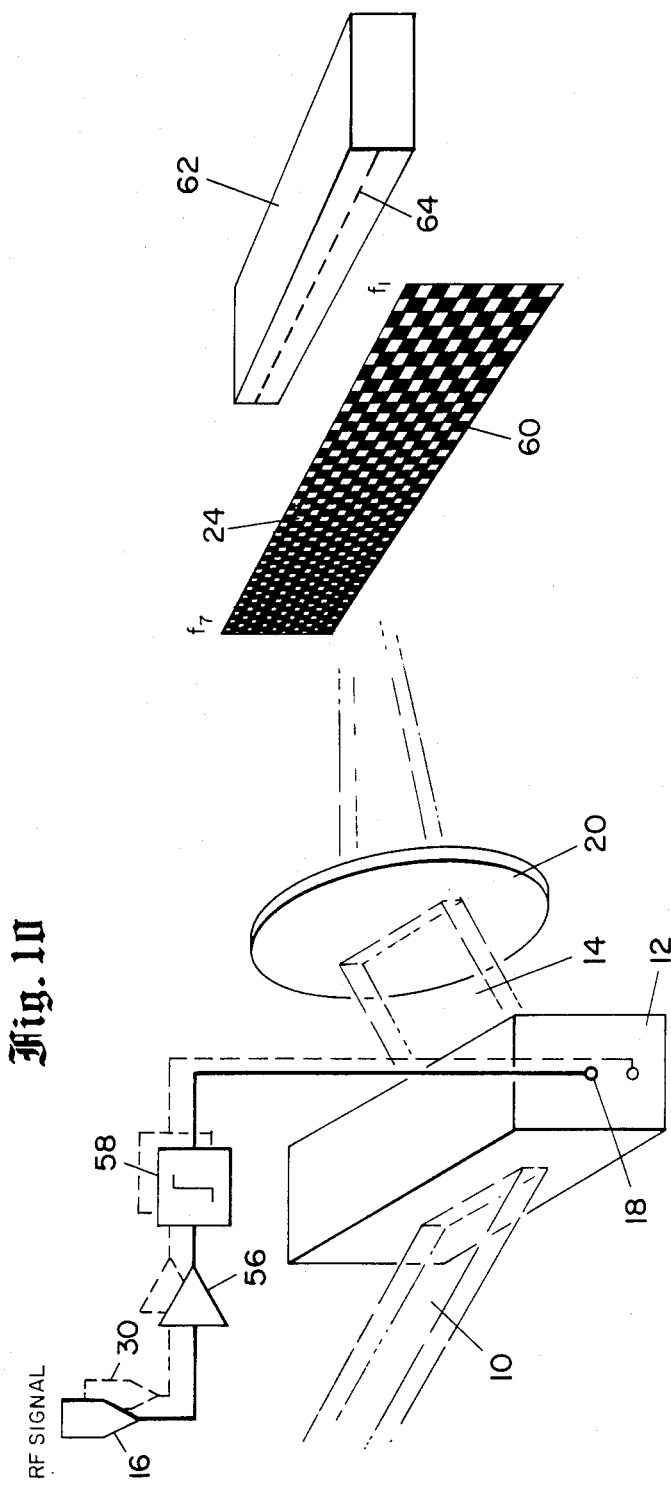
FIG. 10 shows an acousto-optic receiver wherein a graded density optical filter or mask is used to convert angle or spot position into perceived spot amplitude, thus making frequency measurement possible with only a single photosensor element; while a second photosensor provides direction of arrival information.

When an RF signal is amplitude leveled, then no amplitude scaling is required. Centroid location can be inferred from the difference signal of two channels along. In this event, there is a simpler technique for centroid location. FIG. 10 shows an acousto-optic receiver which utilizes this simpler approach. The RF signal from an antenna 16 or other signal source passes through an amplifier 56 and a limiter 58 which ensures that no amplitude variation exists on the signal. The leveled signal is applied to the transducer 18 of Bragg cell 12 and acts to diffract the input light beam 10 into the first order beam 14. The first order beam 14 is passed through a lens 20 and focused onto a focal plane 24 containing a graded density optical filter or mask 60. The graded density mask 60 varies in transmittance from near opaque at one end to nearly clear at the other. A single photodetector 62 placed behind the mask 60 thus sees a variation in optical amplitude which is solely a function of spot position on the mask. In this fashion, spot position is amplitude measured directly by a single photosensitive element 62 in a one-dimensional system.

An analogous technique may be used for resolving both frequency and direction of arrival in a two-dimensional system if for every point on the plane of the mask 60 there is a unique transmittance. As before, a single photodetector 62 is used to resolve the information corresponding to both signal frequency and direction of arrival. An antenna array 30, shown in dashed lines in FIG. 10, provides the input to deflector 12. It is worth noting that the graded mask could be applied directly to the Bragg cell surface, leading towards a highly integrated acousto-optic receiver structure.

In another of the preferred embodiments, the acousto-optic receiver shown in FIG. 10 receives an incoming signal from an antenna array 30, shown in dashed lines. The photosensor 62 is separated along its longitudinal axis 64. In this arrangement, the direction of arrival of the incoming RF signal is seen as a displacement of the centroid of blur spot 34 in a vertical direction along the vertical axis. Similarly, the increased frequency of the incoming RF signal causes the displacement of the blur spot along the horizontal axis 64. Thus, it will be seen that the DOA of the incoming beam will be determined by the centroid detector while the frequency is determined by the amplitude.

It will be understood that the detecting of more than one RF signal at an antenna array 30 in the embodiment of FIG. 10 will require a plurality of divided photodetectors 36 similar to those shown in FIG. 8. Otherwise the several blur spots 34 would produce erroneous information in the single photodetectors 36.

We claim:

1. A device for detecting the centroid of a beam of electromagnetic energy, comprising:
    means for forming a beam of electromagnetic energy having a centroid;
    means for varying the location of said beam and said centroid thereof from a nominal location along an axis;
    photodetector means comprising first and second photodetectors having a separation therebetween which is located at said nominal location of said centroid;
    means for measuring the intensity of said beam upon said photodetectors to produce an output signal proportional to said intensity of said beam upon each photodetector;
    means for measuring the difference between said output signal from each photodetector wherein said measured difference represents the variation of said centroid from said nominal location;
    means for measuring the sum of said output signals from each photodetector;
    means for dividing said measured difference by said measured sum of said output signals, wherein variations in the amplitude of said beam of electromagnetic energy are corrected by said device; and
    said separated photodetectors each including a first electrode of a first polarity and a second electrode of opposite polarity, said fist electrode being of the single type and said second electrode being of the divided type.

2. A device for detecting the centroid of a beam of electromagnetic energy, as claimed in claim 1, additionally comprising:
    a pair of fiber optic electromagnetic energy conductors each having centers mounted on said axis and a common peripheral edge at said nominal location of said beam; and
    said separated photodetector means each mounted to receive said beam of electromagnetic energy from one of said fiber optic conductors.

3. A device for detecting the centroid of a beam of electromagnetic energy, as claimed in claim 2, wherein said photodetector means is a PIN photodiode.

4. A device for detecting the centroid of a beam of electromagnetic energy, as claimed in claim 2, wherein said fiber optic conductors have a cross-sectional dimension substantially equal to the cross-sectional dimension of said beam.

5. A device for detecting the centroid of a beam of electromagnetic energy, as claimed in claim 2, wherein said fiber optic conductors are flat along said common peripheral edge at said nominal location and contact each other along said edge.

6. A device for detecting the centroid of a beam of electromagnetic energy as claimed in claim 2, wherein said beam of electromagnetic energy has a diameter substantially equal to the width and height of said fiber optic conductors.

7. A device for detecting the centroid of a beam of electromagnetic energy, as claimed in claim 2, wherein said means for varying the location of said beam along said axis varies said beam a distance of less than twice the width of said beam along said axis.

8. A device for detecting the centroid of a beam of electromagnetic energy, as claimed in claim 2, wherein said fiber optic conductors have a circular cross section.

9. A device for detecting the centroid of a beam of electromagnetic energy as claimed in claim 2, wherein said fiber optic conductors have a polygonal cross section.

10. An acousto-optic device for detecting the direction of arrival and frequency of a radio frequency wave, comprising:
    an antenna array for receiving said radio frequency wave;
    Bragg cell means for receiving said radio frequency wave from said antenna array;
    focusing means;
    a source of electromagnetic energy mounted for passing a beam of said energy through said Bragg cell which diffracts a part of said beam into a first order beam having a centroid focused by said focusing means upon a focal plane;
    said Bragg cell means diffracting said first order beam alog a first axis in proportion to the direction of arrival of said radio frequency wave at said antenna array and along a second axis in proportion to said frequency of said radio frequency wave at said focal plane;
    electromagnetic energy sensing means mounted at said focal plane;
    said sensing means separated about said second axis into a first and second set of sensing means;
    means for measuring the intensity of said first order beam upon said first and second set of electromagnetic energy sensing means to produce an output signal proportional to said intensity of said beam upon each set;
    means for measuring the difference between said output signal from each set of sensing means wherein said measured difference represents the variation of said centroid along said first axis;
    means for limiting the amplitude of said radio frequency wave connected between said antenna array and said Bragg cell means;

mask means mounted between said focusing means and said sensing means;

said mask means passing more of said first order beam at one extreme of said second axis than at the other, wherein said first and second sets of sensing means detect variations of said first order beam along said first axis and said mask means permit detection of variations of said first order beam along said second axis via variation of the amplitude of said beam;

means for measuring the sum of said output signals from each set of sensing means; and means for dividing said measured difference by said measured sum of said output signals, wherein variations in the amplitude of said first order beam are cancelled by said device.

11. An acousto-optic device, as claimed in claim 10, additionally comprising:

said first and second sets of sensing means separated into a plurality of sensing means by separations parallel to said first axis, wherein said first and second sets of sensing means detect variations of said first order beam along said first axis representing the direction of arrival of said radio frequency wave while said sensing means detect variations of said first order beam along said second axis representing the frequency of said radio frequency wave.

12. An acousto-optic device as claimed in claim 10, additionally comprising:

a plurality of fiber optic electromagnetic energy conductors mounted to receive said first order beam at said focal plane; and said electromagnetic energy sensing means including a plurality of single photodetector means each mounted to receive electromagnetic energy from a single fiber optic conductor.

* * * * *